(12) United States Patent
Tam et al.

(10) Patent No.: US 8,642,387 B2
(45) Date of Patent: Feb. 4, 2014

(54) METHOD OF FABRICATING STACKED PACKAGES USING LASER DIRECT STRUCTURING

(75) Inventors: Samuel Tam, Daly City, CA (US); Bryan Lee Sik Pong, Bukit Raja (MY); Dick Pang, Tsuen Wan (HK)

(73) Assignee: Flextronics AP, LLC, Broomfield, CO (US)

( * ) Notice: Subject to any disclaimer, the term of this patent is extended or adjusted under 35 U.S.C. 154(b) by 88 days.

(21) Appl. No.: 13/286,366

(22) Filed: Nov. 1, 2011

(65) Prior Publication Data

US 2013/0105972 A1    May 2, 2013

(51) Int. Cl.
*H01L 21/00* (2006.01)
*H01L 23/02* (2006.01)

(52) U.S. Cl.
USPC ........... 438/113; 438/126; 438/127; 257/686; 257/788; 257/E23.069; 257/E21.502

(58) Field of Classification Search
None
See application file for complete search history.

(56) References Cited

U.S. PATENT DOCUMENTS

| 7,548,430 B1* | 6/2009 | Huemoeller et al. | 361/760 |
| 7,633,765 B1* | 12/2009 | Scanlan et al. | 361/760 |
| 8,227,338 B1* | 7/2012 | Scanlan et al. | 438/637 |
| 2010/0230795 A1* | 9/2010 | Kriman et al. | 257/686 |
| 2013/0075903 A1* | 3/2013 | Pagaila et al. | 257/737 |

* cited by examiner

*Primary Examiner* — Alonzo Chambliss
(74) *Attorney, Agent, or Firm* — Volpe and Koenig, P.C.

(57) ABSTRACT

Described herein is a stacked package using laser direct structuring. The stacked package includes a die attached to a substrate. The die is encapsulated with a laser direct structuring mold material. The laser direct structuring mold material is laser activated to form circuit traces on the top and side surfaces of the laser direct structuring mold material. The circuit traces then undergo metallization. A package is then attached to the metalized circuit traces and is electrically connected to the substrate via the metalized circuit traces.

8 Claims, 10 Drawing Sheets

METHOD OF FABRICATING STACKED PACKAGES USING LASER DIRECT STRUCTURING

FIELD OF INVENTION

This application is related to packaging of electronic devices.

BACKGROUND

The desire for smaller, compact, cheaper and feature rich electronic devices, such as digital cameras, digital video cameras, phones, music players and the like, drives and forces minimization and efficient use of circuit boards.

SUMMARY

Described herein is a stacked package using laser direct structuring. The stacked package includes a die attached to a substrate. The die is encapsulated with a laser direct structuring mold material. The laser direct structuring mold material is laser activated to form circuit traces on the top and side surfaces of the laser direct structuring mold material. The circuit traces then undergo metallization. A package is then attached to the metalized circuit traces and is electrically connected to the substrate via the metalized circuit traces.

DETAILED DESCRIPTION

It is to be understood that the figures and descriptions of embodiments of the stacked package using laser direct structuring have been simplified to illustrate elements that are relevant for a clear understanding, while eliminating, for the purpose of clarity, many other elements found in typical electronics packaging. Those of ordinary skill in the art may recognize that other elements and/or steps are desirable and/or required in implementing the present invention. However, because such elements and steps are well known in the art, and because they do not facilitate a better understanding of the present invention, a discussion of such elements and steps is not provided herein.

The non-limiting embodiments described herein are with respect to electronic devices. Other devices, modules and applications may also be used in view of these teachings without deviating from the spirit or scope as described herein. The stacked package using laser direct structuring may be modified for a variety of applications and uses while remaining within the spirit and scope of the claims. The embodiments and variations described herein, and/or shown in the drawings, are presented by way of example only and are not limiting as to the scope and spirit. The descriptions herein may be applicable to all embodiments of the stacked package using laser direct structuring although it may be described with respect to a particular embodiment.

Figure 1:
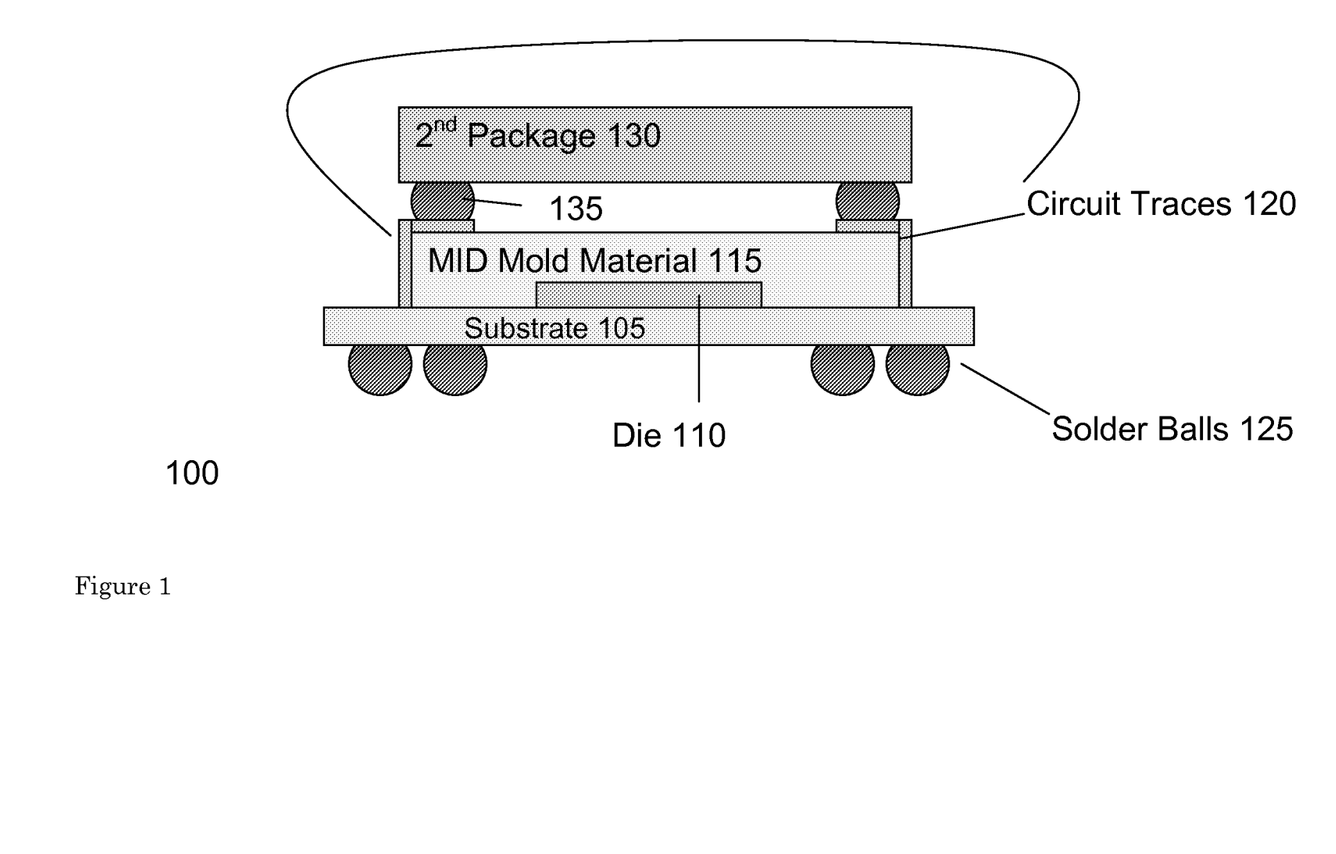
FIG. 1 shows an embodiment of a stacked package using laser direct structuring.

In general, FIG. 1 shows an embodiment of a stacked package 100 using laser direct structuring (LDS). The stacked package 100 may include a substrate 105 that has a die 110 attached to one surface and solder balls 125 mounted on another surface. The die 110 may be encapsulated with molded interconnect device (MID) molding material 115. By way of non-limiting example, the MID molding material 115 may be a laser direct structuring mold material. Circuit traces 120 are created on the MID molding material 115. A second package 130 may be mounted to the circuit traces 120 using a number of available techniques as described herein. By way of non-limiting example, FIG. 1 shows the second package 130 connected via solder balls 135. The circuit traces 120 provide a connection path between the second package 130 and the substrate 105.

A MID part is an injection molded thermoplastic part with integrated circuit traces using high temperature thermoplastics and structured metallization. The MID technology combines plastic components and circuitry in one part through selective metallization and may be implemented using LDS or two shot molding processes.

In general, the LDS process may use a thermoplastic material, doped with a metal-plastic additive activated by means of laser. A mold is created and a laser then writes the circuit trace on the plastic where the laser beam hits the plastic and the metal additive forms a micro-rough track. The metal particles of this track form the nuclei for the subsequent metallization. In an electro-less copper bath the conductor path layers arise precisely on these tracks. Plating with nickel and gold may be done in this manner. The LDS process nominally has a wide range of materials, full three-dimensionality in a sphere, and flexibility for changed routing of traces by the laser unit. Different functional components may be produced from one basic unit and fine traces with a diameter of <80 microns are possible.

Procedurally, in one embodiment, the LDS process nominally uses one shot injection molding of commercially available doped thermo-plastic. The laser-activatable thermoplastic is doped with a special additive that is activated by the laser beam. A physical chemical reaction forms metallic nuclei. These act as a catalyst for reductive copper plating. In addition to the activation, the laser creates a microscopically rough surface in which the copper is firmly anchored during metallization. Metallization of the LDS parts, i.e., the circuitry, is next. An additive build-up of the traces, typically up to 5 to 8 um with electro-less copper baths, is followed by plating with nickel and gold.

As illustrated in FIG. 1, the stacked package using LDS provides the ability to do package on package stacking and results in an effective 3D integration of devices. In a non-limiting example, stacked packaging using LDS may enable the stacking of high density logic devices and memory devices together. This vertical packaging integration is implemented using MID technology applied to packaging and in particular, by using MID molding material for the transfer molding process. Moreover, miniaturization may be achieved due to the highly integrated packages. This results in a small form factor product with a small footprint. The stacked package may reduce main printed circuit board real estate area and may provide shorter interconnections for faster data transfer rate.

Figure 2A:
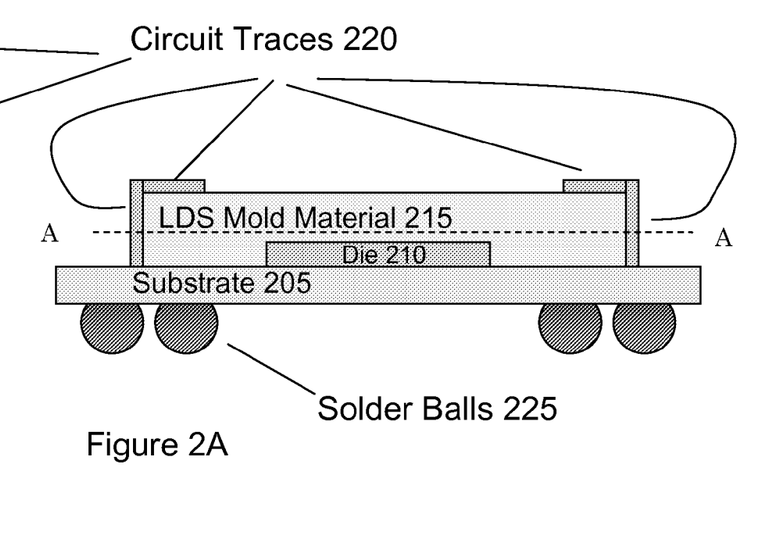
FIGS. 2A, 2B and 2C show different sections and views of an embodiment of a stacked package using laser direct structuring.
Figure 2B:
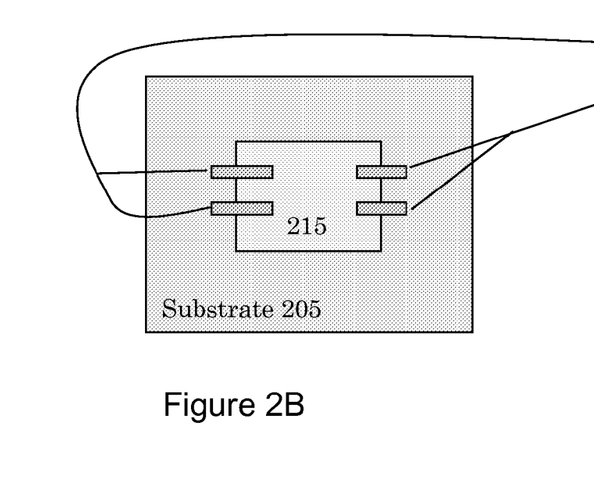

FIGS. 2A, 2B and 2C show different sections and views of an embodiment of a stacked package using laser direct structuring. FIG. 2A shows a substrate 205 that has a die 210 attached to one surface and solder balls 225 mounted on another surface. That is, the package platform may be a land grid array (LGA), ball grid array (BGA), plastic ball grid array (PBGA) or the like. The die 210 may be encapsulated with a LDS molding material 215. After encapsulating the die 210 with the LDS molding material 215, a surface of the LDS molding material 215 may be activated using 3D laser beams and plated with Ni/Au plating to create circuit traces 220 on the LDS molding material 215. The circuit traces may connect the top and side surfaces of the LDS molding material 215 with the substrate 205. FIG. 2B shows a cross-sectional view taken along line A-A of the embodiment shown in FIG. 2A. As illustrated, the circuit traces 220 may establish multiple connections paths to the substrate 205 along a top surface and side surfaces of the LDS molding material 215.

Figure 2C:
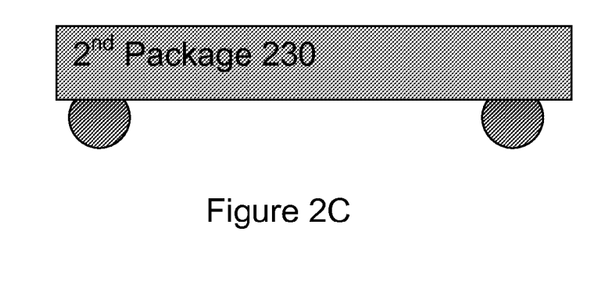

FIG. 2C shows a package 230 that may be stacked on the circuit traces 220. The package 230 may be any type of package and may include flip chip packages, chip scale packages, wire bonding packages, lead frame packages, surface mounted passives, passive components, active components and the like, by way of non-limiting examples.

Figure 3:
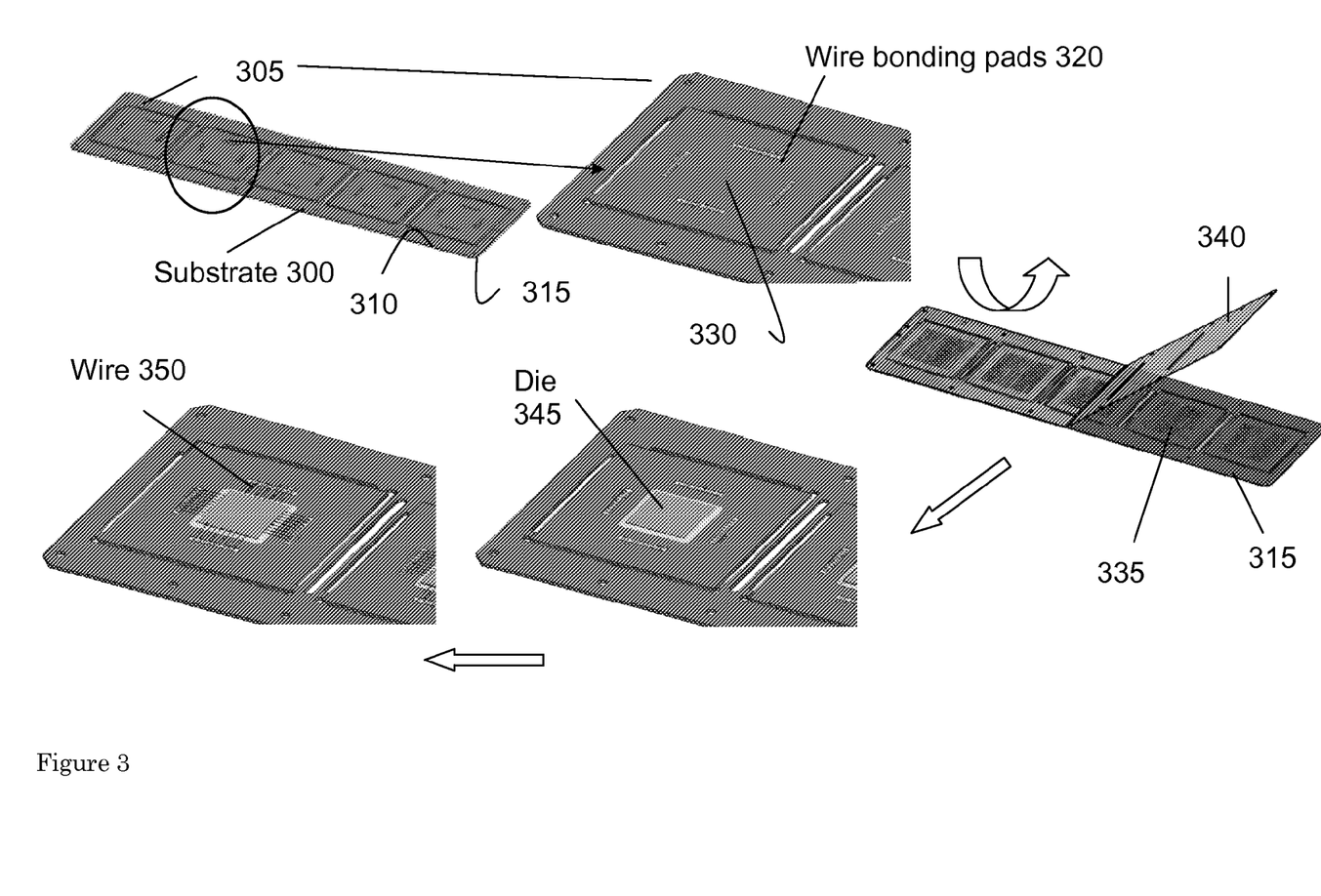
FIG. 3 shows an embodiment and process view of a stacked package substrate with die bond and wire bond processing.

FIGS. 3-7 show an embodiment and process flow for a stacked package using LDS. FIG. 3 shows a substrate strip 300 that may have multiple substrate units 305. The substrate may be flexible tape, ceramics, lead frame, rigid substrate such as bis-maleimide triazine (BT) or FR4 material and the like. Each substrate unit 305 may have a top surface 310 and a bottom surface 315. Each substrate unit 305 may further have wire bonding pads 320 on the top surface 310, by way of non-limiting example. The wire bonding pads 320 may be arranged in a rectangular format to form a die attach section 330. The bottom surface 310 may have solder ball mounting pads 335, by way of non-limiting example. A protective film 340 may be attached to the bottom surface 310 to protect the solder ball mounting pads 335 from further processing. Attachment of the protective film is done at the substrate strip level.

A die 345 may be placed and wire bond attached to the die attach section 330 in each substrate unit 305 using wires 350. Other techniques such as flip-chip bonding techniques and processes known to those of skill in the art may also be used. These may include, by way of non-limiting example only, thermo-compression or thermo-sonic flip chip bonding techniques. Die attachment is done at the substrate strip level.

Figure 4:
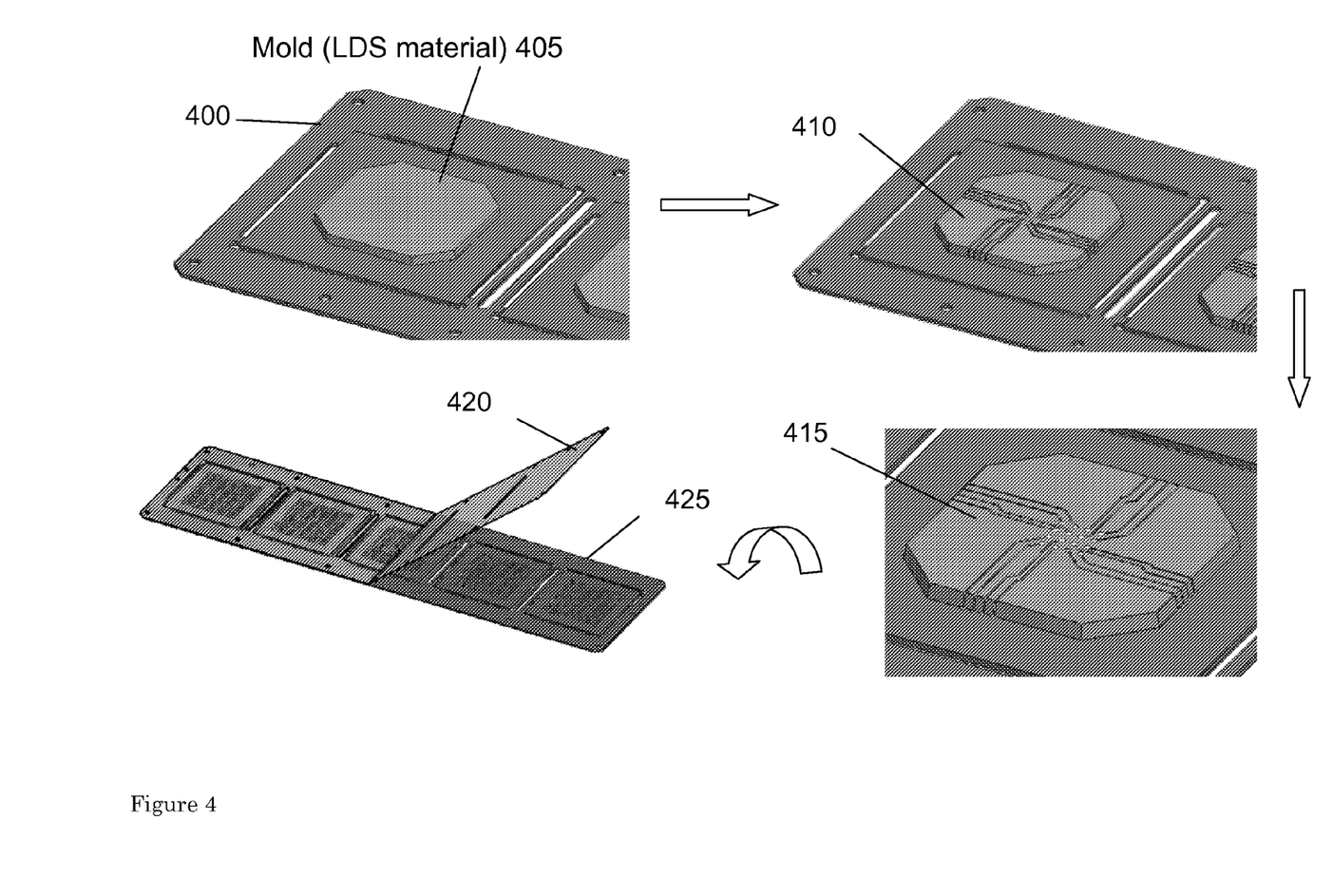
FIG. 4 shows an embodiment and process view of a stacked package substrate with molding, circuit creation and metallization processing.

FIG. 4 shows an embodiment and process view of a stacked package substrate with molding, circuit creation and metallization processing. FIG. 4 shows a substrate unit 400 having an attached die (not visible) that is covered with a mold 405. The mold 405 may be implemented using mold transfer techniques and processes known to those of skill in the art. The mold may be a LDS mold or other MID mold material. The mold transfer may be done at the strip level to increase efficiencies and decrease costs.

The mold 405 may then be activated by using a laser to create circuitry 410 on the surface of the mold 405. Metallization processing may then be applied to the circuitry 410 to create plated circuit traces 415. The substrate unit 400 may then be flipped over and a protective film 420 may be removed from a bottom surface 425.

Figure 5:
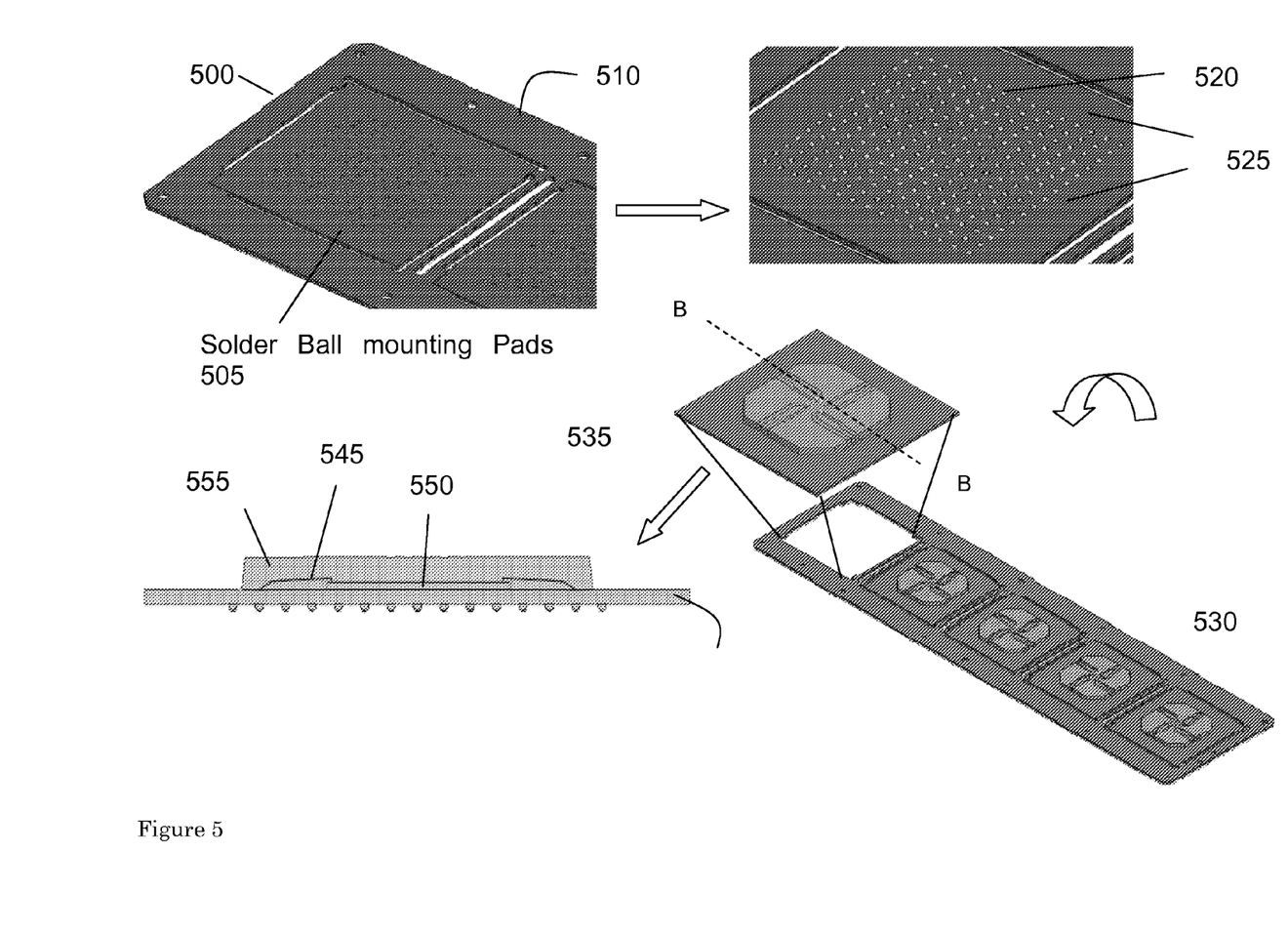
FIG. 5 shows an embodiment and process view of a stacked package substrate with solder ball attachment and singulation for an un-stacked configuration with a ball grid array.

FIG. 5 shows an embodiment and process view of a stacked package substrate with solder ball attachment and singulation for an un-stacked configuration with a ball grid array. FIG. 5 shows solder ball mounting pads 505 on a bottom surface 510 of a substrate unit 500. Solder balls 520 are attached to the solder ball mounting pads 505 to create a ball grid array 525 using solder ball attachment and reflow techniques and processes known to those of skill in the art. Singulation may then by used to separate an unstacked BGA substrate unit 535 from an unstacked BGA substrate strip 530. Singulation may be done using techniques and processes known to those of skill in the art.

A cross-sectional view of the unstacked BGA substrate unit 535 taken along line B-B shows a substrate 540 with a wire bonded 545 die 550. The die 550 is encapsulated with a metalized circuit (not visible) mold material 555. The unstacked BGA substrate unit 525 may then be sent to an electronic manufacturing service (EMS) to have surface mounted components (SMTs) mounted on the BGA 525 and/or on the metalized circuit mold material 555. Another package as described herein above may also be attached to the metalized circuit mold material 555.

Stacked package using LDS may provide a flexible design since this can work with most packages and work with different package suppliers. It may lead to faster times to market and non-recurring engineering (NRE) tooling may be minimal since this may only require a change to the laser programming. The ability to fully test packages eliminates the known good die (KGD) issue due to die yields. Added flexibility includes having the choice of pre-stacked packages on the component level or un-stacked packages for the EMS to do the final stacking during the board assembly. The stacked package using LDS may improve logistics, provide procurement flexibility, and maintain confidential or proprietary information.

Figure 6:
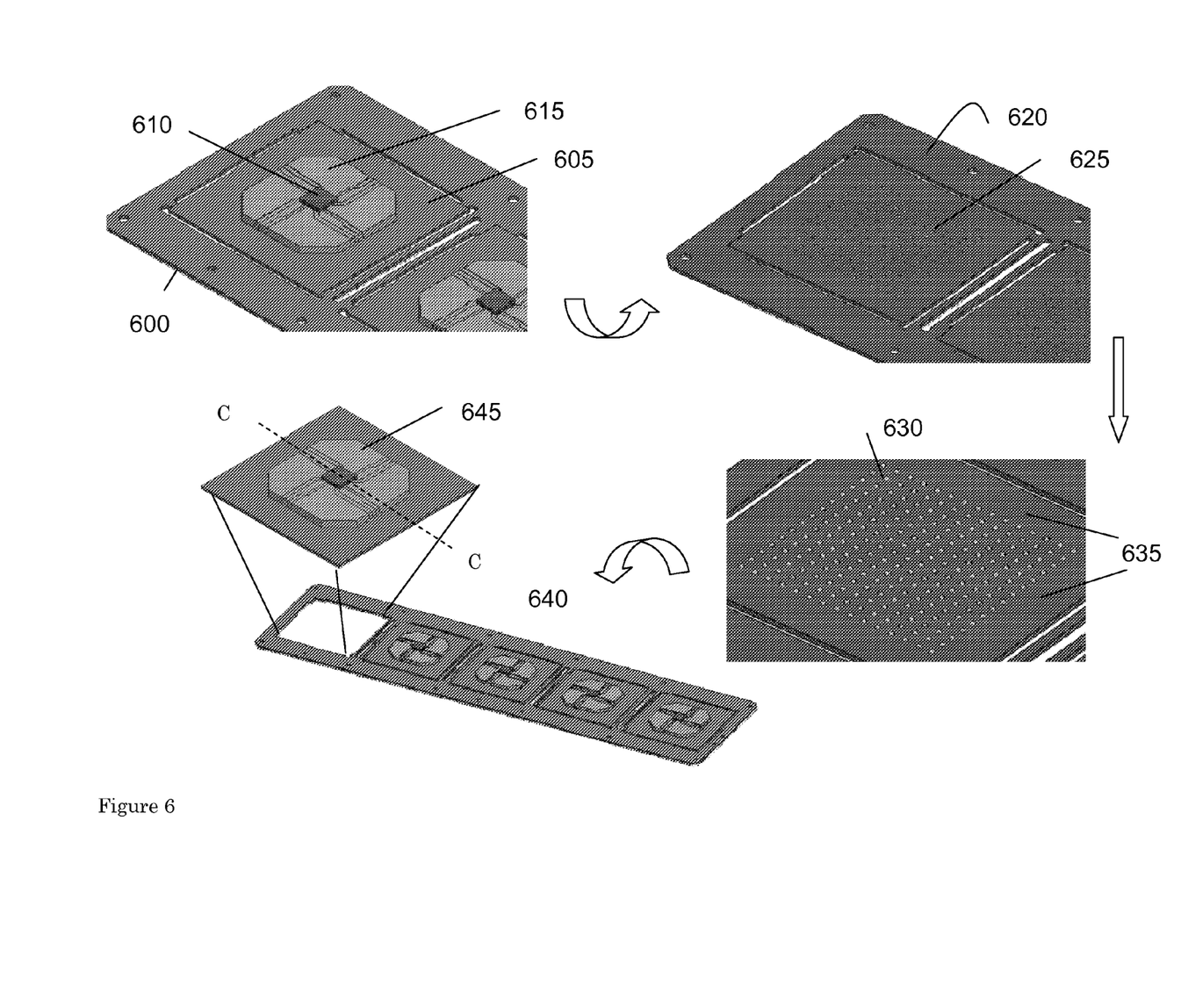
FIG. 6 shows an embodiment and process view of a stacked package substrate with solder ball attachment and singulation for a pre-stacked configuration with a ball grid array.

FIG. 6 shows an embodiment and process view of a stacked package substrate with solder ball attachment and singulation for a pre-stacked configuration with a ball grid array. FIG. 6 shows a pre-stacked substrate unit 605 of a pre-stacked substrate strip 600, where a package 610 is attached to a metalized circuit mold material 615. The package 610 may be attached using flip-chip bonding techniques and processes known to those of skill in the art. These may include, by way of non-limiting example only, thermo-compression or thermo-sonic flip chip bonding techniques as well as flip chip bonding with conductive epoxy and flip chip bonding using anisotropic conductive paste (ACP).

A bottom surface 620 of the pre-stacked substrate strip 600 may include solder ball mounting pads 625. As described hereinabove, solder balls 630 are attached to the solder ball mounting pads 625 to create a ball grid array 635 using solder ball attachment and reflow techniques and processes known to those of skill in the art. Singulation may then be used to separate a pre-stacked BGA substrate unit 645 from a pre-stacked BGA substrate strip 640. Singulation may be done using techniques and processes known to those of skill in the art.

Figure 7:
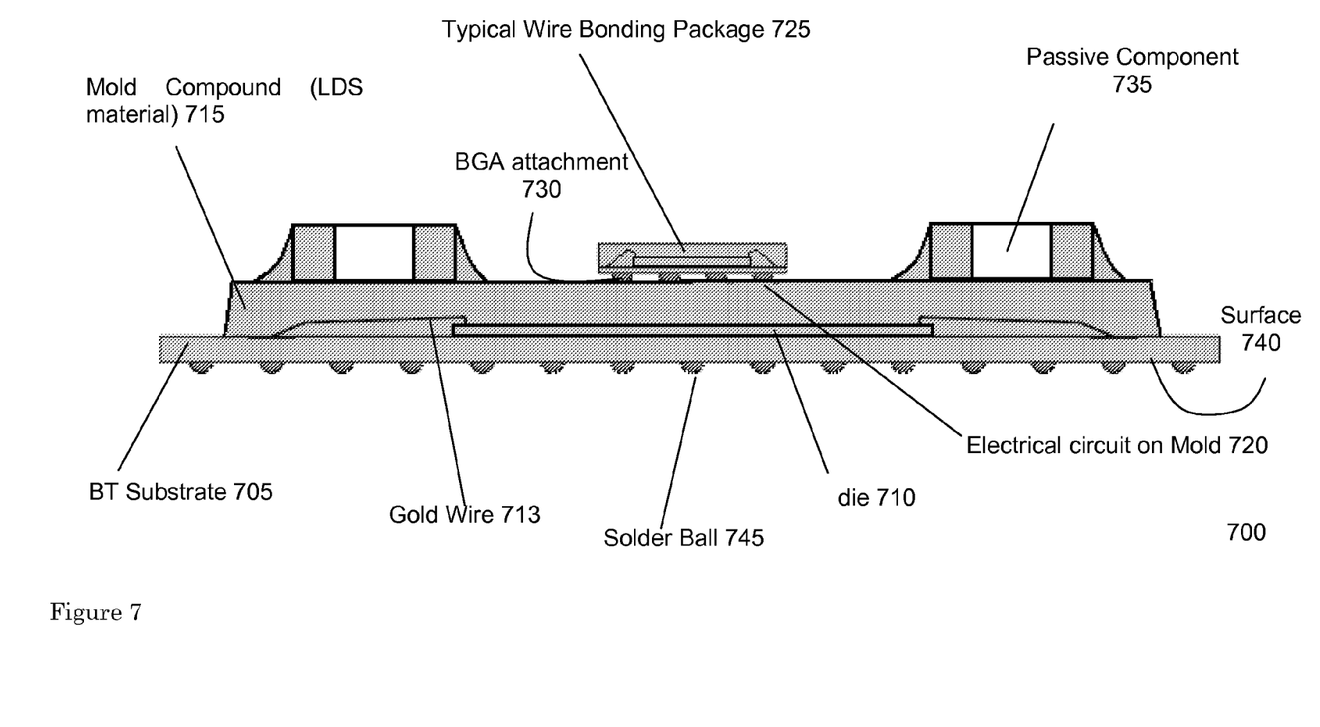
FIG. 7 shows a cross-sectional view of an embodiment of a stacked package with a pre-stacked configuration with a ball grid array.

FIG. 7 shows a cross-sectional view of a pre-stacked BGA substrate unit 700 taken along line C-C in FIG. 6. Pre-stacked BGA substrate unit 700 includes a substrate 705 having a die 710 wire bond attached with wire 713. Wire 713, by way of non-limiting example, may be gold wire. The die 710 may be encapsulated with a mold material 715 having a metalized circuit 720. A package 725 may be attached or mounted on the metalized circuit 720 using BGA attachment 730 techniques and processes known to those of skill in the art. The package 725, by way of non-limiting example, may be a wire bonded package. SMTs 735 may be attached or mounted on the metalized circuit 720 using techniques and processes known to those of skill in the art. A bottom surface 740 of the pre-stacked substrate unit 700 may include solder balls 745 to form a ball grid array.

Figure 8:
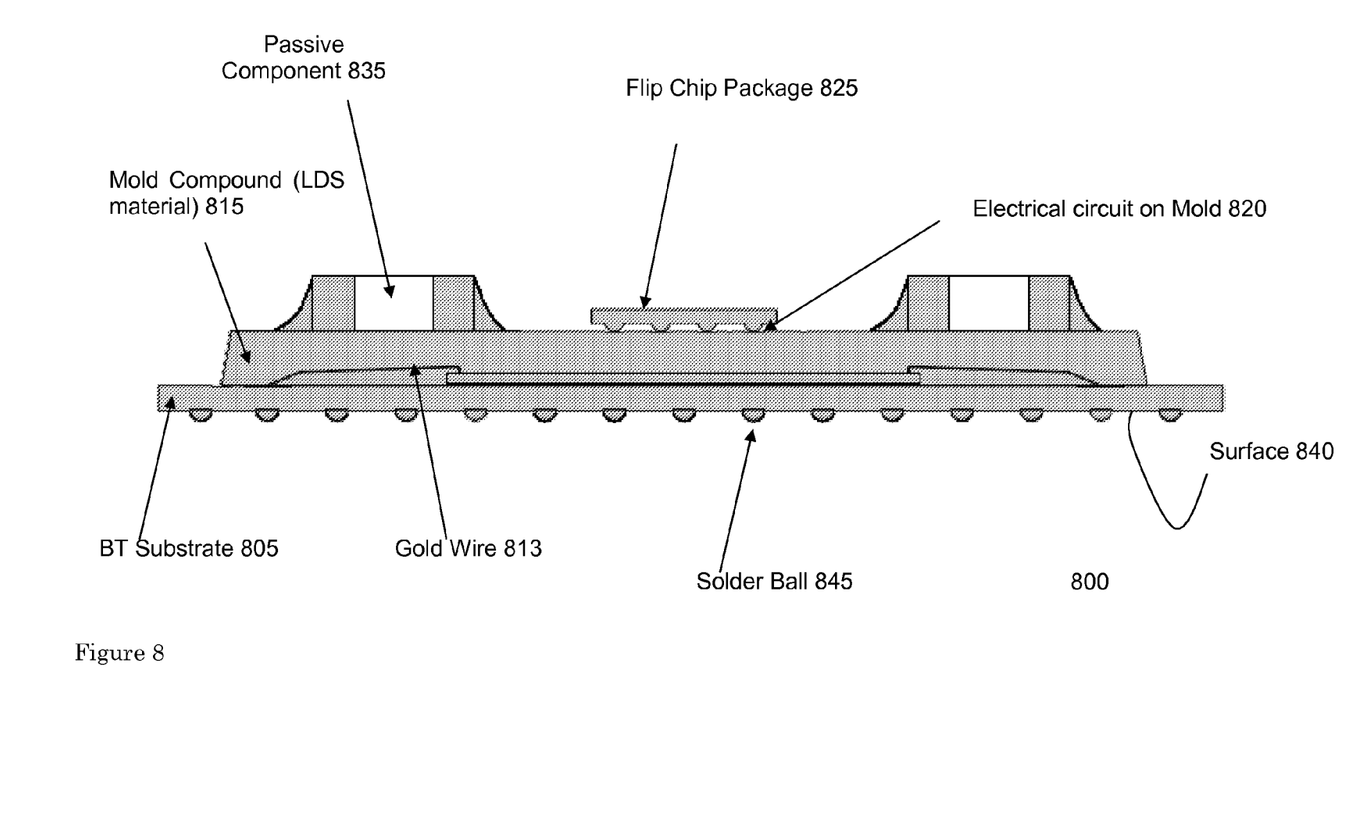
FIG. 8 shows a cross-sectional view of an embodiment of a stacked package with a pre-stacked flip-chip configuration with a ball grid array.

FIG. 8 shows a cross-sectional view of a pre-stacked flip chip BGA substrate unit 800. Pre-stacked flip chip BGA substrate unit 800 includes a substrate 805 having a die 810 wire bond attached with wire 813. Wire 813, by way of non-limiting example, may be gold wire. The die 810 may be encapsulated with a mold material 815 having a metalized circuit 820. A package 825 may be attached or mounted on the metalized circuit 820 using flip chip attachment techniques and processes known to those of skill in the art and described hereinabove. SMTs 835 may be attached or mounted on the metalized circuit 820 using techniques and processes known to those of skill in the art. A bottom surface 840 of the pre-stacked substrate unit 800 may include solder balls 845 to form a ball grid array.

Figure 9:
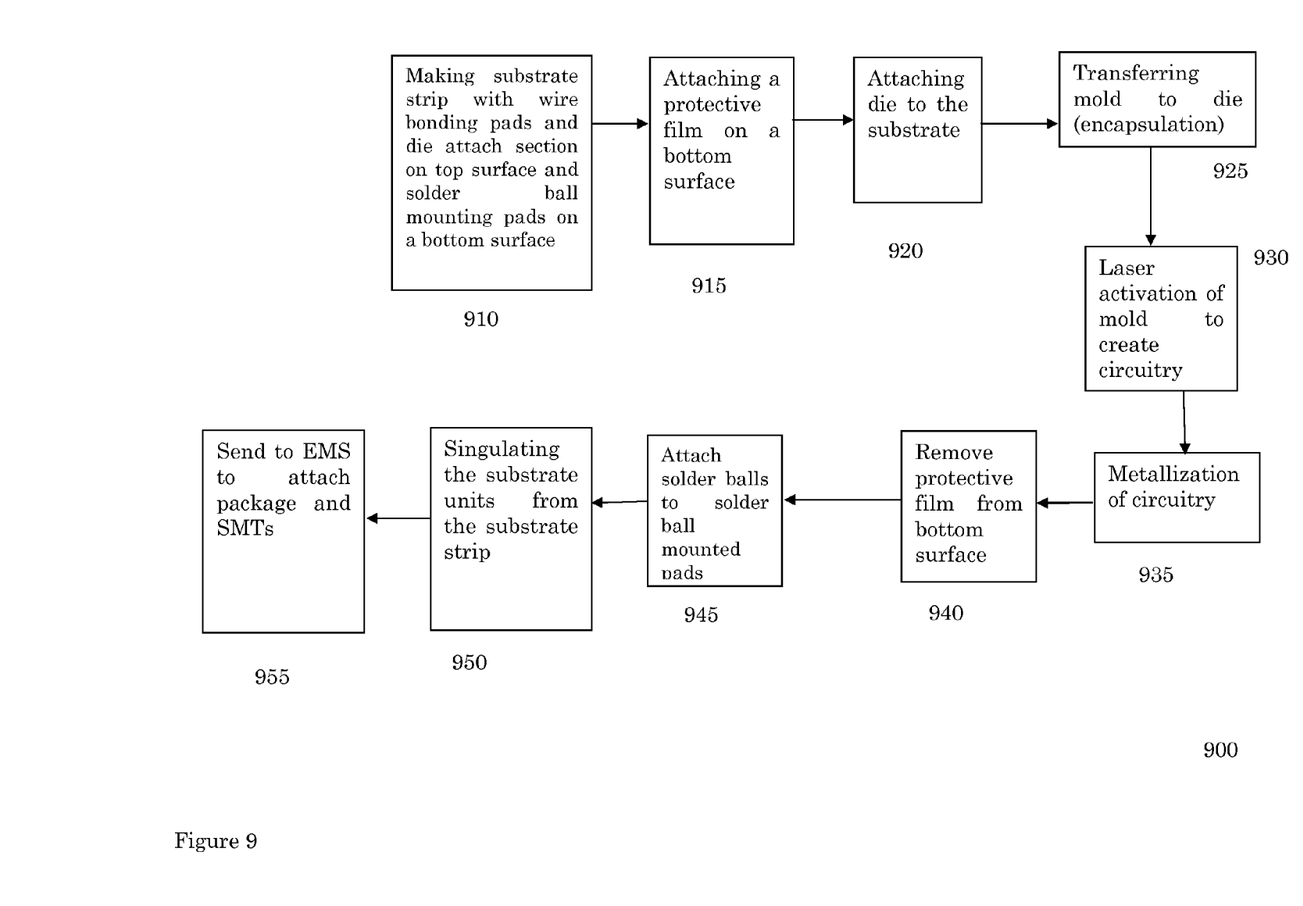
FIG. 9 is an example flowchart for manufacturing a stacked package using laser direct structuring in an un-stacked configuration.

FIG. 9 is an example flowchart 900 for manufacturing a stacked package using laser direct structuring in an un-stacked configuration. A substrate may be processed to include wire bonding pads and a die attach section on a top surface and solder ball mounting pads on a bottom surface (910). A protective film may be attached to bottom surface (915). A die is attached to the substrate as described hereinabove (920). The die may be encapsulated with LDS mold material (925). The mold material is laser activated to create circuitry on the mold material (930). The circuitry undergoes metallization (935). The protective film is removed from the bottom surface (940). Solder balls are attached to solder ball mounting pads to create BGA (945). Each substrate unit is singulated from the substrate strip (950) and is sent to an EMS for package and SMT attachment (955).

Figure 10:
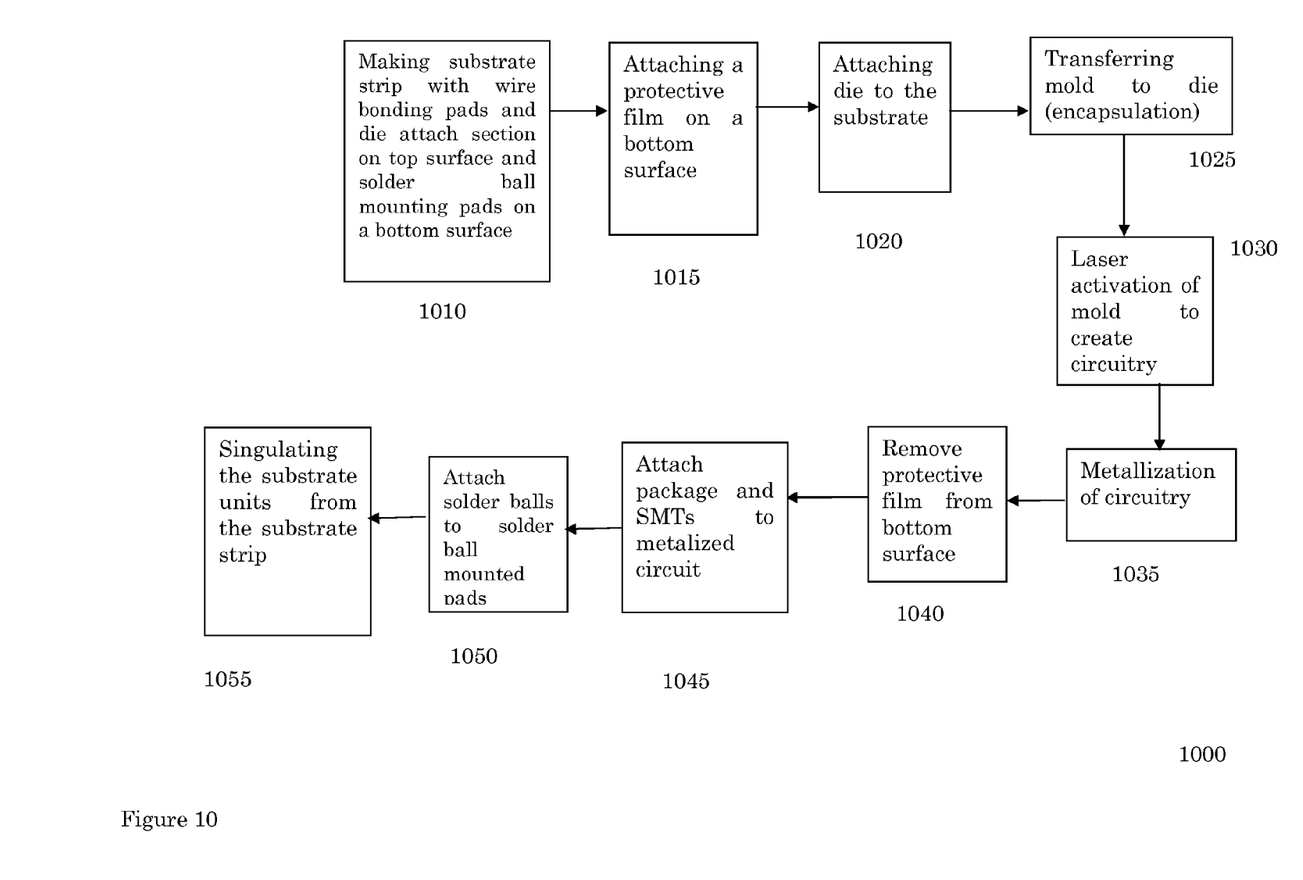
FIG. 10 is an example flowchart for manufacturing a stacked package using laser direct structuring in a pre-stacked configuration.

FIG. 10 is an example flowchart 1000 for manufacturing a stacked package using laser direct structuring in a pre-stacked configuration. A substrate may be processed to include wire bonding pads and a die attach section on a top surface and solder ball mounting pads on a bottom surface (1010). A protective film may be attached to bottom surface (1015). A die is attached to the substrate as described hereinabove (1020). The die may be encapsulated with LDS mold material (1025). The mold material is laser activated to create circuitry on the mold material (1030). The circuitry undergoes metallization (1035). The protective film is removed from the bottom surface (1040). A package and/or SMTs are attached to the metalized circuitry on the mold (1045). Solder balls are attached to solder ball mounting pads to create BGA (1050). Each substrate unit is singulated from the substrate strip (1055).

As described herein, the methods described herein are not limited to any particular element(s) that perform(s) any particular function(s) and some steps of the methods presented need not necessarily occur in the order shown. For example, in some cases two or more method steps may occur in a different order or simultaneously. In addition, some steps of the described methods may be optional (even if not explicitly stated to be optional) and, therefore, may be omitted. These and other variations of the methods disclosed herein will be readily apparent, especially in view of the description of the stacked package described herein, and are considered to be within the full scope of the invention.

Although features and elements are described above in particular combinations, each feature or element can be used alone without the other features and elements or in various combinations with or without other features and elements.

What is claimed is:

1. A method for manufacturing a stacked package using laser direct structuring (LDS), comprising:
   preparing a substrate strip with at least one die;
   encapsulating each die with LDS mold material;
   laser activating at least one surface of the LDS mold material on the at least one die to form circuit traces on the LDS mold material;
   metalizing the circuit traces; and
   attaching a package on metalized circuit traces.

2. The method of claim 1, further comprising:
   providing solder ball mounting pads on a surface opposite an attached die.

3. The method of claim 2, further comprising:
   attaching solder balls to the solder ball mounting pads to form a ball grid array.

4. The method of claim 1, further comprising:
   attaching a protective film to a surface opposite an attached die that protects solder ball mounting pads.

5. The method of claim 1, further comprising:
   singulating a substrate unit from the substrate strip after metallization of the circuit traces.

6. The method of claim 1, further comprising:
   singulating a substrate unit from the substrate strip.

7. The method of claim 1, further comprising:
   attaching components to the metalized circuit traces.

8. The method of claim 1, wherein the package is attached using one of flip chip attachment or ball grid array attachment.

* * * * *